United States Patent [19]

Brewer et al.

[11] 4,048,534

[45] Sept. 13, 1977

[54] RADIAL FLOW ELECTRON GUN

[75] Inventors: George R. Brewer, Malibu; Kurt Amboss, Pacific Palisades, both of Calif.

[73] Assignee: Hughes Aircraft Company, Culver City, Calif.

[21] Appl. No.: 670,471

[22] Filed: Mar. 25, 1976

[51] Int. Cl.² .......................... H01J 1/46; H01J 21/10
[52] U.S. Cl. ............................. 313/293; 313/348; 313/420; 313/441
[58] Field of Search ............. 313/191, 193, 293, 249, 313/348, 356, 351, 420, 441; 315/39.3; 331/94.5 PE

[56] References Cited

U.S. PATENT DOCUMENTS

| | | | |
|---|---|---|---|
| 2,466,063 | 4/1949 | Varian | 313/293 X |
| 2,797,353 | 6/1957 | Molnar et al. | 315/39.3 X |
| 3,210,602 | 10/1965 | Orr | 315/39.3 |
| 3,702,412 | 11/1972 | Quintal | 313/420 |
| 3,818,375 | 6/1974 | Stapleton et al. | 331/94.5 PE |
| 3,962,656 | 6/1976 | Peressini | 313/349 |

Primary Examiner—Saxfield Chatmon, Jr.
Attorney, Agent, or Firm—Allen A. Dicke; W. H. MacAllister

[57] ABSTRACT

Radial electron flow in an elongated electron gun is achieved from a unipotential, planar cathode by locating the cathode with respect to the gun axis and with respect to a cylindrical divergent anode lens so that the lens focal line lies on the gun axis. The effect of the accelerating field on the distortion of the radial flow is reduced by employing a deep anode grid to reduce the penetration of the accelerating field into the anode drift region.

3 Claims, 5 Drawing Figures

Fig. 3.
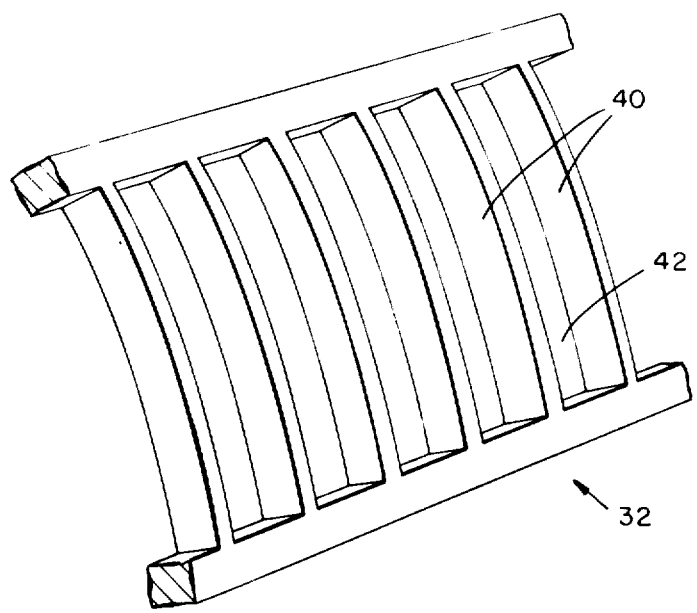
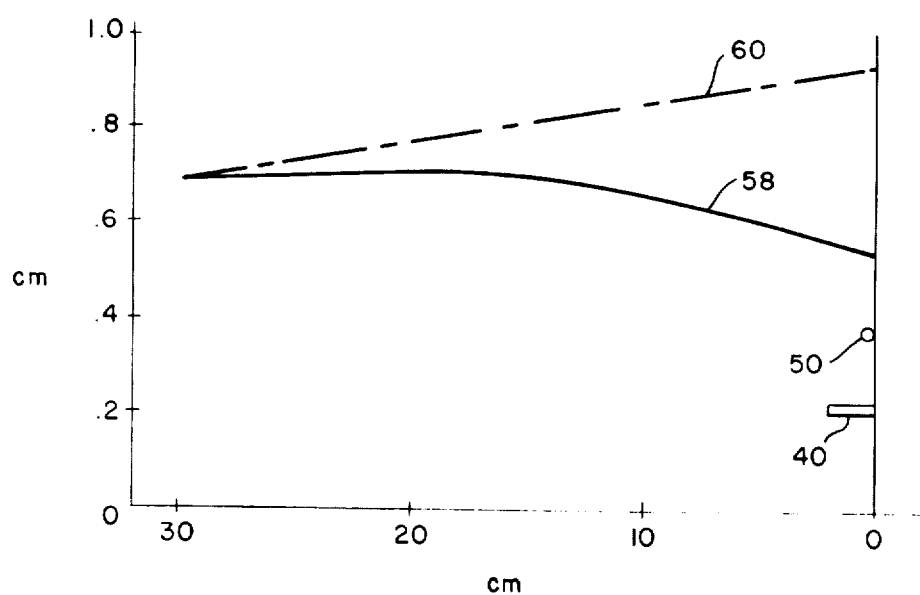
Fig. 5.

RADIAL FLOW ELECTRON GUN

BACKGROUND

This invention is directed to a radial flow electron gun of elongated large area design.

R. C. Knechtli U.S. Pat. No. 3,831,052 describes a hollow cathode gas discharge device which can be designed with considerable length to achieve electron discharge in a large area, along a fairly long window. It can be employed wherever a high density beam of electrons is required, such as in exciting a laser or for the curing of paint, and like uses. The background also includes an article entitled "The Design of Large Area Electron Beam Guns" published at the Electron and Ion Beam Science and Technology Conference on May 12-17, 1974 by Kurt Amboss. This is a background article discussing a variety of electron design solutions with their relative attractiveness depending upon the constraints imposed by the foil window, type of cathode, voltage breakdown, uniform current density, and current uniformity during modulation. A number of solutions are suggested, particularly relating the various limitations. However, the problem and solution of accelerating field perturbation on electron flow in the anode drift region is not disclosed.

Whenever uniform electron delivery or exposure is required, particular attention must be paid to the electron optical design to produce a beam of large area which is capable of retaining a highly uniform current density distribution over a wide range of operating currents.

SUMMARY

In order to aid in the understanding of this invention it can be stated in essentially summary form that it is directed to a radial flow electron gun capable of substantially uniform current density distribution. This is achieved by use of a cathode properly located with respect to an anode lens and having Pierce electrodes to provide uniform flow to the anode lens and with the anode lens positioned so that its focal point (or more properly, focal line) provides proper divergence through the anode grid to a utilization point such as a window at accelerating potential. The anode grid is sufficiently deep to prevent accelerating field penetration to reduce distortion of the radial flow.

It is thus an object of this invention to provide a radial flow electron gun which is capable of producing a beam of large area and which is also capable of retaining highly uniform electron current density distribution over the gun area and over a wide range of operating currents. It is another object to provide an inexpensive and reliable electron gun employing a thermionic cathode. It is a further object to provide a thermionic cathode with Pierce electrodes to produce a uniform space charge limited parallel electron flow to an anode lens where radial flow is achieved.

Other objects and advantages of this invention will become apparent from the following portion of the specification, the claims, and the attached drawings.

BRIEF DESCRIPTION OF THE DRAWINGS

FIG. 3 is a further enlarged perspective view of the bar grid.

FIG. 5 is a plot of the trajectory of a beam adjacent a bar grid and another beam adjacent a round wire grid.

DESCRIPTION

Figure 1:
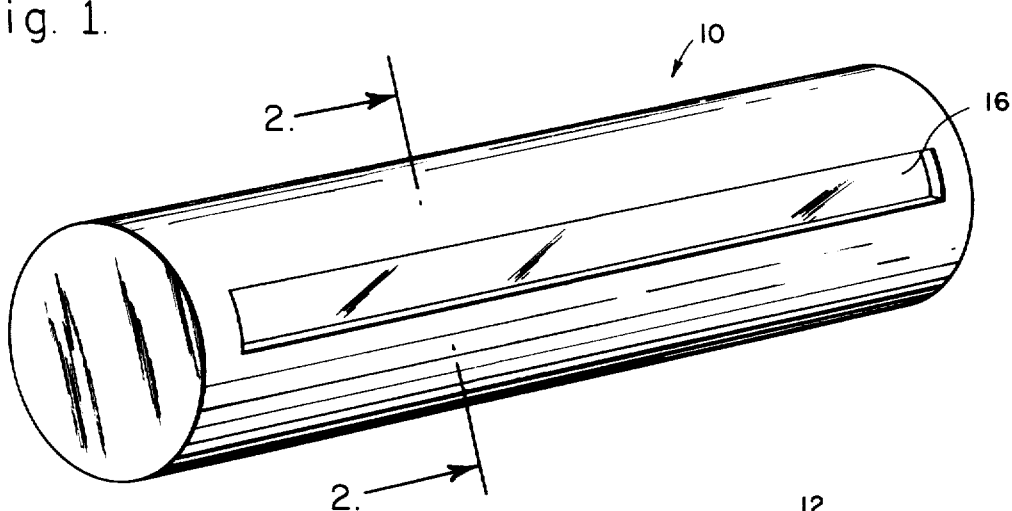
FIG. 1 is a perspective view of the radial flow electron gun of this invention.
Figure 2:
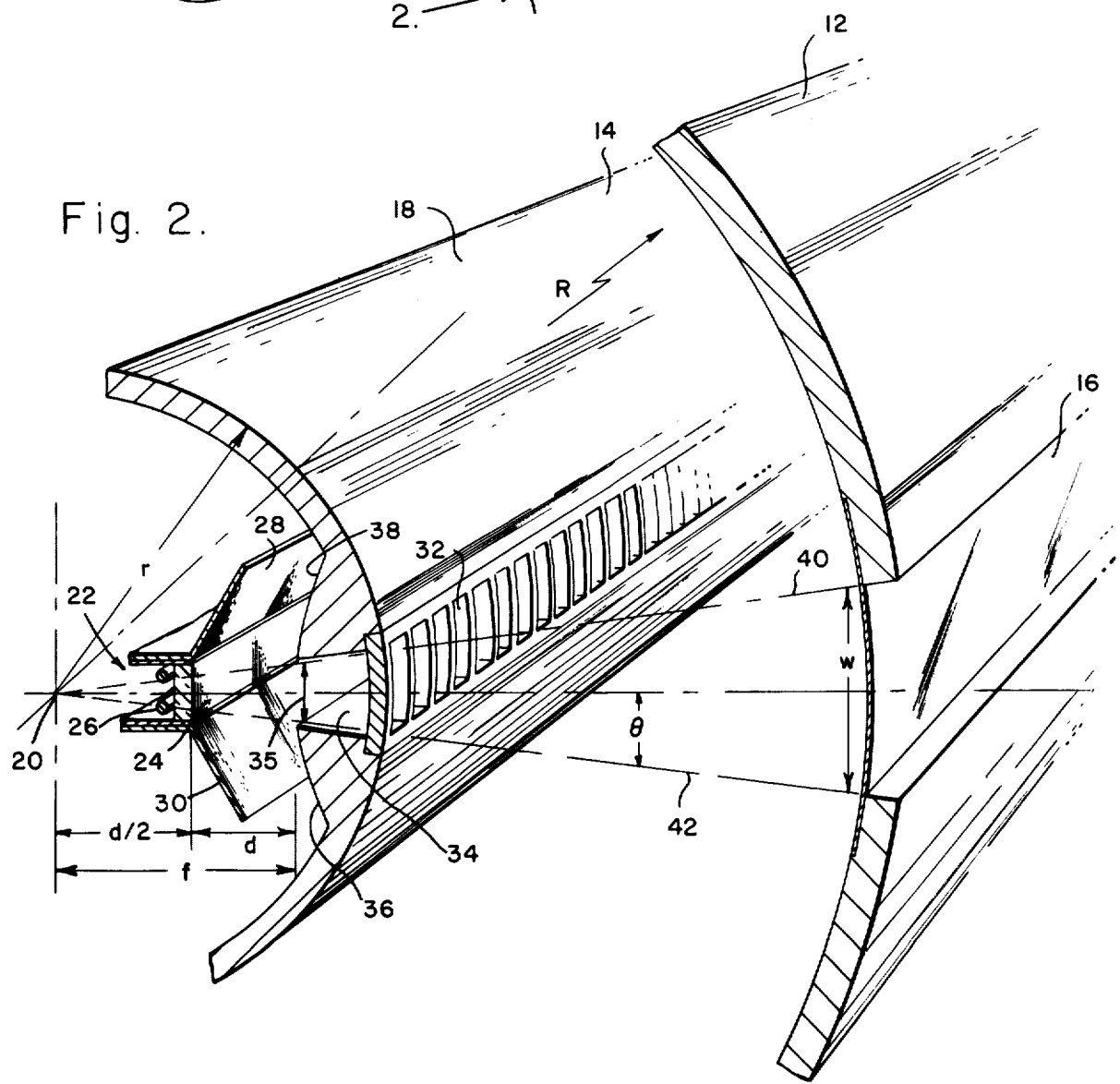
FIG. 2 is an enlarged section with parts broken away taken generally along line 2—2 of FIG. 1.

The radial flow electron gun of this invention is generally indicated at 10 in FIG. 1. As is seen in FIGS. 1 and 2, electron gun 10 is of generally cylindrical design, with closed ends. Cylinder 12 which forms the outer shell is vacuum tight so that a thermionic cathode at high vacuum can be employed. It also serves as the accelerator anode and its cylindrical form produces radial field lines in space 14. Interiorally of outer shell 12 is vacuum chamber 14. Since the electron beam is usually used in a gaseous environment, passage of the electron beam from the interior vacuum to the exterior space in which it is utilized is through window 16. Window 16 is of thin foil which is usually supported on a grid for structural support. The shape of the window is rectangular and ranges in length from 20 to 200 cm and in width from 2 to 20 cm. The interior surface of shell 12, including the foil of window 16 is cylindrical about axis 20 with radius R.

The useful current density can be as low as 0.05 and high as 50 milliamps per square cm. For industrial use fixed continuous current density in the neighborhood of 2 milliampere per square cm is usually needed. A beam uniformity of plus or minus 5 percent over the whole area is usually required. Relatively good transmission of the beam through window 16 is obtained by accelerating voltage in excess of 120 kv. The voltage is applied to shell 12 acting as an accelerator anode electrode with respect to electrode 18.

Electrode 18 is also cylindrical with its cylindrical axis also lying on axis 20. It acts as the Pierce gun anode. The outer surface of electrode 18 is a smooth cylinder of radius $r$. The cylindrical surfaces defining chamber 14 provide uniform cylindrical accelerator potential lines, to prevent beam perturbation.

Thermionic cathode 22 is formed of thermionic emissive material. A convenient, economic structure is elongated planar bar 24. A paper by H. Gallagher published in the *Journal of Applied Physics*, Vol. 40, p. 44 (1969) describes the characteristics of several of these cathodes. A tungsten matrix dispenser cathode was used as the source in the present structure. Heater 26 is positioned behind the bar of emissive material to produce the emission. From the planar cathode surface emission is parallel in the absence of perturbations. Pierce electrodes 28 and 30 are positioned adjacent the planar cathode surface and are at cathode potential to maintain parallel flow by preventing lateral trajectories. Space charge limited flow from the cathode to entrane 35 between walls 34 and 36 establishes a uniform emission density from the cathode.

Most of electrode 18 is thin walled, but thickening adjacent slot 34 produces walls 36 and 38 which are convex toward cathode 22. Slot opening 35 between the walls 36 and 38 is the same width as bar 24 of cathode 22 and parallel flow is achieved to the slot. However, the lens action of the slot opening 35 is such that the field at the Pierce anode 18 has a divergent electron lens at the entrance to the slot. The lens has focal length $f$ and is positioned so that its focus lies on the geometric axis 20 as illustrated in FIG. 2. The focal length of the lens is to a good approximation equal to $3/2d$ where $d$ is the spacing between the front surface of the planar cathode and entrance 35 to anode slot 34, as seen in FIG. 2. Radial flow of the electrons beyond the anode, as indicated by flow lines 40 and 42, is achieved when the cathode is spaced a distance $d/2$ from the common axis 20 of the cylinders.

The semiangle $\theta$ of divergence of the gun is determined by the width $s$ of the cathode, such that tan $\theta$ equals $s/3d$. The width W of the beam at the foil is $W = R2s/3d$. The beam passes out of the cathode to anode space through a drift space in slot 34 closed off by the bar grid 32, and then passes into the accelerating field in space 14 provided by the radial accelerating potential on shell 12. The exterior surface of bar grid 32 and anode 18 have a radius of curvature $r$ where $r/R$ equals 2.718. This is the value of the natural logarithm $e$ so that the field at electrode 18 is at a minimum.

As the electrons emerge from slot 34 in the cylindrical Pierce anode 18, they enter the interelectrode space 14 between electrode 18 and cylindrical outer shell 12 which is at accelerating potential. Grid 32 is positioned in the outlet of slot 34 and has its outer surface in line with the cylindrical outer surface of anode 18. The acceleration field in the interelectrode space is strong 12 KV/cm or above, and this field will penetrate thin, round wire grids into the drift space in slot 34. The bar grid 32 shown in more detail in FIG. 3 is an essential, critical part of this invention. The bars 40 of bar grid 32 must be a depth in the direction of electron flow of at least approximately twice the space between bars, such as space 42. In a particular structure the bars are 0.040 inch deep, 0.010 inch thick and are spaced 0.020 inch. In the circumferential direction the bars are 4.0 inches.

Figure 4:
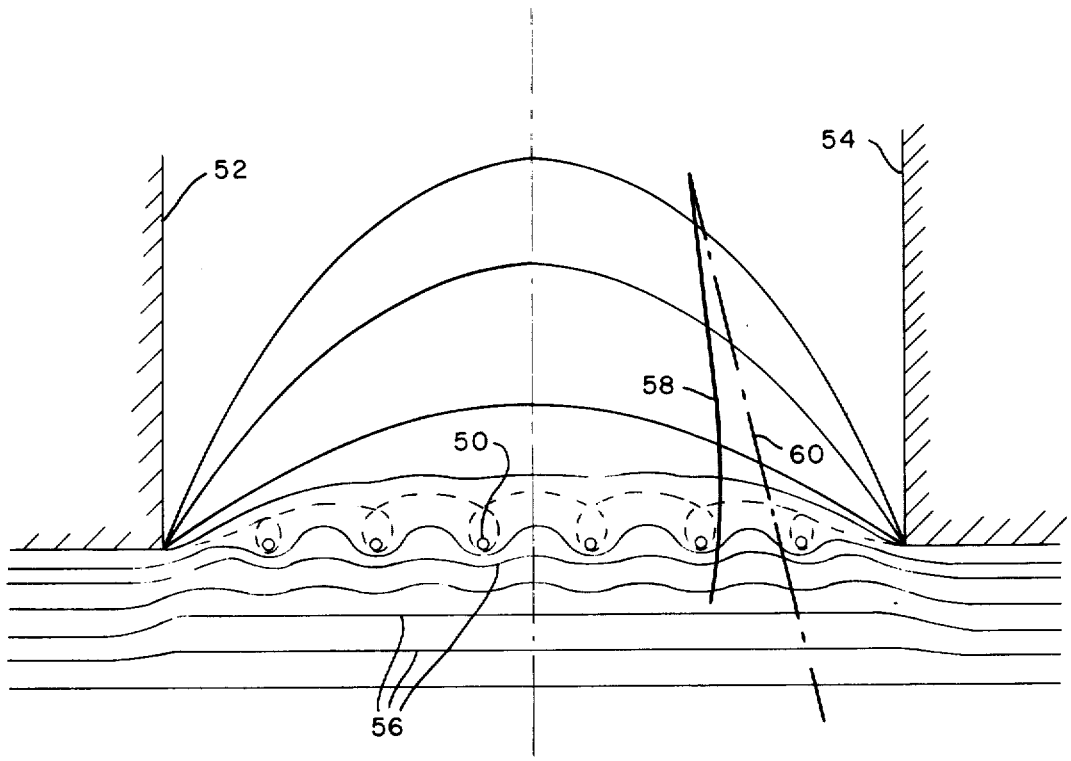
FIG. 4 is a schematic diagram of the manner in which electric field lines penetrate a round wire grid.

FIG. 4 schematically shows the field penetration through a thin round wire grid 50 which closes off a space between walls 52 and 54 which represents an electron drift space. Electric field equipotentials 56 are shown as penetrating from a uniform field region at the lower part of the drawing and through the grid 50. The equipotential lines above the grid are on a smaller voltage difference than the ones below the grid, and are probably averages of voltage spikes extending through the openings in grid 50. This field penetration through the grid causes focusing of the electron beam, to perturb its planned pattern.

In FIG. 5, a curve 58 is the path of an electron adjacent wall 52 toward grid 50. The abscissa of curve 58 is the motion downward in FIG. 4 to zero at grid 50 while the ordinate is the deflection of the electron from its desired divergent path caused by the acceleration field penetration through the grid. Curve 60 shows the path of a similar electron drifting toward a bar grid such as grid 32. This is the desired undeflected divergent path.

In this way electron flow in a uniform divergent beam is achieved. The relationship between the positioning of the cathode between the anode cylinder and the axis, and the related positioning and radius of curvature of the various parts, together with the use of a deep bar grid results in very uniform current density in the critical dimension normal to the long axis of the beam. A bar grid of this type does cause small amounts of focusing, but principally in the axial direction and not in the tangential direction. The uniformity results from the simplicity of the electron flow pattern because it is radial and from the uniformity of emission from the cathode because it is space charge limited. Radial flow in the accelerator region, where the accelerating field equipotential lines are cylindrically oriented achieves the desired uniform result.

This invention having been described in its preferred embodiment, it is clear that it is susceptible in numerous modifications and the embodiments within the ability of those skilled in the art and without the exercise of the inventive faculty. Accordingly, the scope of this invention is defined by the scope of the following claims.

We claim:

1. An electron gun comprising:
   an elongated planar electron source for providing parallel electron flow therefrom along the length of said electron gun said electron source being a heated strip of thermionic material having a front surface for emitting electrons;
   a tubular anode having an external surface which is cylindrical with respect to an axis and having a slot therethrough parallel to said axis, said electron source being positioned within said anode between said slot and the axis of said cylindrical anode surface, said anode slot forming an electron lens at the inner surface of said anode, said lens having a focus substantially on said axis to form a cylindrically divergent electron beam in said slot, this positioning being such as to produce divergent electron flow with radial electron paths which are independent of beam current and anode voltage;
   Pierce electrodes positioned adjacent said thermionic cathode surface and extending in an axial direction so that a parallel flow of electrons is delivered by said source to said slot and electron lens action in said slot causes beam divergence;
   a bar grid in said slot, the external surface of said bar grid lying in line with said cylindrical exterior surface of said anode, said bar grid having bars which have a bar depth in the direction of electron flow at least substantially twice the bar grid spacing in the axial direction so that said bars are of sufficient depth in the direction of beam flow and with close enough spacing in a direction parallel to said axis that the electric field external of said anode does not substantially penetrate and slot so that radial beam flow is unperturbed; and
   an accelerator electrode having a cylindrical interior surface with its axis lying on said axis of said anode, a window in said accelerator electrode, said window lying at the interior cylindrical surface of said accelerator electrode so that accelerating electric equi-potential lines between said anode and said accelerator electrode are uniformly cylindrical to accelerate the electron beam in a radial direction with the beam passing through said window so that current density distribution at said window is independent of beam current and anode voltage.

2. The electron gun of claim 1 wherein said accelerator electrode is an enclosing housing so that vacuum can be maintained therein.

3. The electron gun of claim 1 wherein said front surface of said heated strip of thermionic material is substantially twice as far from said electron lens at said anode slot as it is from said axis.

* * * * *